United States Patent
Kinoshita et al.

(10) Patent No.: US 6,495,891 B1
(45) Date of Patent: Dec. 17, 2002

(54) TRANSISTOR HAVING IMPURITY CONCENTRATION DISTRIBUTION CAPABLE OF IMPROVING SHORT CHANNEL EFFECT

(75) Inventors: Hiroyuki Kinoshita, Tokyo (JP); Takeshi Shimane, Chigasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/645,555

(22) Filed: Aug. 25, 2000

(30) Foreign Application Priority Data

Aug. 25, 1999 (JP) ............................................. 11-238771

(51) Int. Cl.$^7$ .......................... H01L 29/76; H01L 29/94
(52) U.S. Cl. ...................... 257/404; 257/285; 257/286; 257/402; 257/403; 438/143; 438/282; 438/514; 438/543
(58) Field of Search ................................. 257/402, 404, 257/403, 285, 286, 287, 345, 607, 657, 919; 438/217, 282, 143, 514, 543

(56) References Cited

U.S. PATENT DOCUMENTS 5,753,943 A   5/1998  Okabe et al.
5,874,329 A   2/1999  Neary et al.
6,020,608 A   2/2000  Kamashita

OTHER PUBLICATIONS

G.G.Shahidi etal. "Electron Velocity OVershoot at room and Liquid Nitrogen Temperatures in SIlicon Inversion layers", IEEE Electron Device Lett., vol. 9, No. 2, pp94–96, Feb. 1988.*

Richard C. Jaeger, "Microelectronic Circuit Design", pp 118–119, McGraw Hill.*

J. B. Jacobs et al., "Channel Profile Engineering For MOS-FET's With 100 nm Channel Lengths," *IEEE Transactions On Electron Devices*, vol. 42, No. 5, May 1995, pp. 870–875.

Shahidi, G.G., et al., "Indium Channel Implants for Improved MOSFET Behavior at the 100nm Channel Length Regime", IEEE Transactions on Electron Devices (1989), vol. 36, p. 2605.

YuanChen Sun, J. et al., "Submicrometer–Channel CMOS for Low–Temperature Operation", Electron Devices (1987), vol. 34, p. 19.

* cited by examiner

*Primary Examiner*—Steven Loke
*Assistant Examiner*—Donghee Kang
(74) *Attorney, Agent, or Firm*—Finnegan, Henderson, Farabow, Garrett & Dunner, L.L.P.

(57) ABSTRACT

A semiconductor device has source and drain regions, a gate insulating film, a gate electrode, and a channel region. The channel region includes a region where carriers move between the source and drain regions. An impurity concentration of the channel region is higher at an end portion of a surface depletion layer than at an interface between the semiconductor layer and the gate insulating film. The impurity concentration varies along a direction in which the gate electrode, the gate insulating film and the channel region are successively provided, and it increases substantially linearly near the end portion of the surface depletion layer.

19 Claims, 5 Drawing Sheets

TRANSISTOR HAVING IMPURITY CONCENTRATION DISTRIBUTION CAPABLE OF IMPROVING SHORT CHANNEL EFFECT

CROSS-REFERENCE TO RELATED APPLICATIONS

This application is based upon and claims the benefit of priority from the prior Japanese Patent Application No. 11-238771, filed Aug. 25, 1999, the entire contents of which are incorporated herein by reference.

BACKGROUND OF THE INVENTION

The present invention relates to a semiconductor device having a refined transistor, and more particularly to an impurity concentration profile in a channel region of a transistor.

In recent years, as semiconductor devices are refined, a technique for suppressing short channel effect in a MOS (MIS) transistor has become important. A MOS transistor has a threshold voltage determined by the thickness of a gate oxide film, the impurity concentration of a channel region, the material of a gate electrode, etc. The threshold voltage does not essentially depend on the channel length. However, as the channel length is decreased with refinement of the device, the threshold voltage is lowered by two-dimensional effect, such as a decrease in space charge in a surface depletion layer in the channel region and a reduction in potential barrier at an end of a source region. This is called short channel effect. When the channel is shorter than a certain length, the threshold voltage is abruptly reduced, resulting in malfunction of the MOS transistor.

A conventional MOS transistor will be described with reference to FIGS. 1 to 3. FIG. 1 shows a cross section of a MOS transistor.

As shown in FIG. 1, a gate electrode 11 is formed on a gate oxide film 12, which is formed on a semiconductor substrate 10. Impurity diffusion layers serving as source and drain regions 13 and 14 are formed by ion implantation in the semiconductor substrate 10 on both sides of the gate electrode 11. The part of the semiconductor substrate 10 between the source and drain regions 13 and 14 serves as a channel region 15.

FIG. 2 shows an impurity concentration profile of the channel region 15 along the depth direction with respect to the distance from the substrate surface of the conventional MOS transistor taken along the line 2—2' in FIG. 1. As shown in FIG. 2, generally, the impurity concentration is kept constant with respect to the depth (case 1) or the concentration is distributed such that the concentration in the surface region is high and gradually lowered with the depth in consideration of the controllability of the threshold voltage (case 2).

FIG. 3 shows the dependence of a threshold voltage Vth on a channel length L in a MOS transistor having distribution of the impurity concentration in the channel region as described above. The thickness Tox of the gate insulating film 12 is 60 Å and the diffusion depth Xj of the source and drain regions 13 and 14 is 0.12 $\mu$m. The impurity concentration is set such that the threshold voltage Vth is 0.60V in the case where the channel length L is satisfactorily long.

As shown in FIG. 3, in the case 1 wherein the impurity concentration in the channel region is kept constant at $4.67 \times 10^{17}$ cm$^{-3}$, the threshold voltage Vth is gradually lowered as the channel length L becomes shorter. When the channel length L is about 0.30 $\mu$m, the threshold voltage Vth is 0.5V. When the channel length L is 0.20 $\mu$m, the threshold voltage Vth is 0.308V and the MOS transistor does not perform the essential functions thereof.

In the case 2 wherein the impurity concentration of the surface region of the semiconductor substrate 10 is distributed such that it is at its peak $1.05 \times 10^{18}$ cm$^{-3}$ on the surface of the semiconductor substrate (the impurity concentration is $1.0 \times 10^{17}$ cm$^{-3}$) and gradually lowered with the distance below the surface, the short channel effect is greater than in the case 1. Thus, the condition is far from desirable from the viewpoint of reliability of the operation of the MOS transistor.

For this reason, in the conventional semiconductor device, the channel length L of a MOS transistor must be strictly controlled, or the thickness Tox of the gate oxide film or the diffusion depth Xj of the source and drain regions 13 and 14 must be reduced, so that the short channel effect can be suppressed. As a result, the manufacturing is burdened and a highly-developed technique is required.

In addition, as described above, the conventional MOS transistor, in which the impurity concentration in the channel region is kept constant or distributed so as to reduce with the depth, has a problem that the short channel effect is significant and hinders refinement of the MOS transistor. Further, the short channel effect adversely influences the reliability of the MOS transistor.

A proposal for reducing the short channel effect of the MOS transistor as described above is disclosed in IEEE TRANSACTIONS ON ELECTRON DEVICES (1989) Vol. 36, p 2605, G. G. Shahidi et al., "Indium Channel Implants for Improved MOSFET Behavior at 100-nm Channel Length Regime". According to this prior art reference, the impurity concentration is set low in a surface region of a semiconductor substrate in order to suppress reduction of mobility due to impurity scattering, and set high in a deep portion of the semiconductor substrate in order to suppress the short channel effect. According to another prior art reference, ELECTRON DEVICES (1987) Vol. 34, p 19, Sun et al., "Submicrometer-Channel CMOS for Low-Temperature Operation", the impurity concentration profile is set to a Gaussian distribution in which the concentration is at its peak in an inner portion of the substrate, thereby obtaining high mobility and low junction capacitance.

However, these reports of the prior art merely describe a tendency for the distribution of the impurity concentration to influence the mobility or the short channel effect. Therefore, to realize an actual device free from the above problems, a number of other factors must be further considered and optimized.

BRIEF SUMMARY OF THE INVENTION

A semiconductor device according to an aspect of the present invention comprises: source and drain regions spaced apart from each other in a semiconductor layer; a gate insulating film formed on a surface of the semiconductor layer between the source and drain regions; a gate electrode formed on the gate insulating film, said gate insulating film being interposed between the semiconductor layer and the gate electrode; and a channel region, formed in contact with at least a portion of the gate insulating film, including a region where carriers move between the source and drain regions, an impurity concentration of said channel region being higher at an end portion of a surface depletion layer, formed of a MIS structure comprising the gate electrode, the gate insulating film and the semiconductor layer, than at an interface between the semiconductor layer and the gate insulating film; wherein the impurity concentration varies along a direction in which the gate electrode, the gate insulating film and the channel region are successively provided, and it increases substantially linearly near the end portion of the surface depletion layer.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
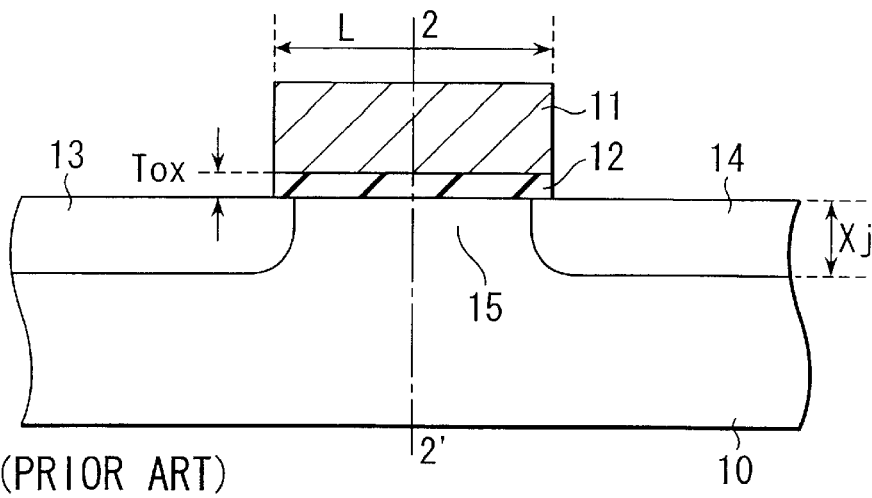
FIG. 1 is a cross sectional view showing a conventional MOS transistor.
Figure 2:
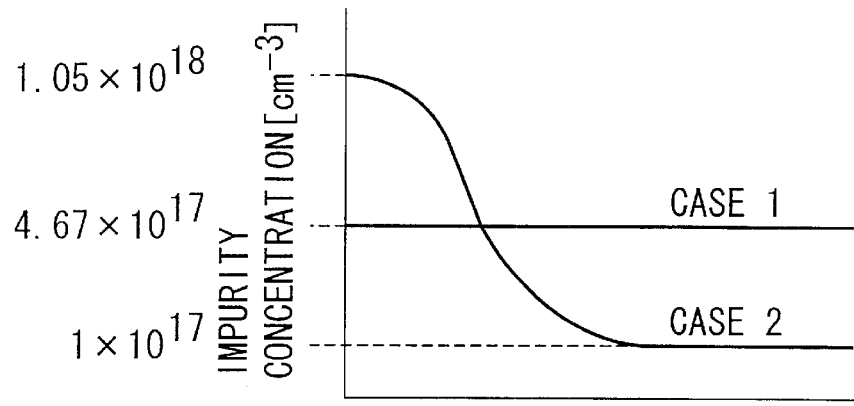
FIG. 2 is a concentration distribution diagram showing an impurity concentration profile taken along the line 2–2' in FIG. 1.
Figure 3:
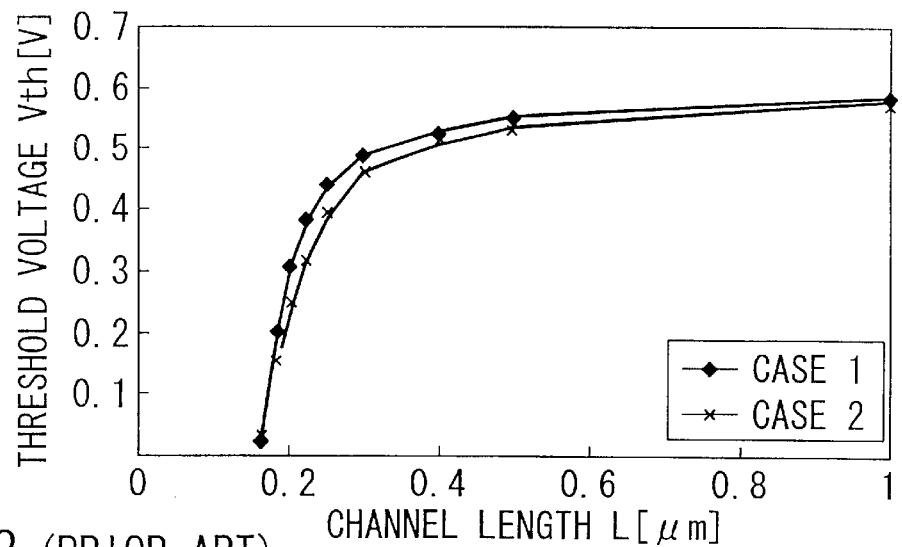
FIG. 3 is a characteristic diagram showing the dependence of a threshold voltage on a channel length in a MOS transistor having the impurity concentration profile shown in FIG. 2.
Figure 4:
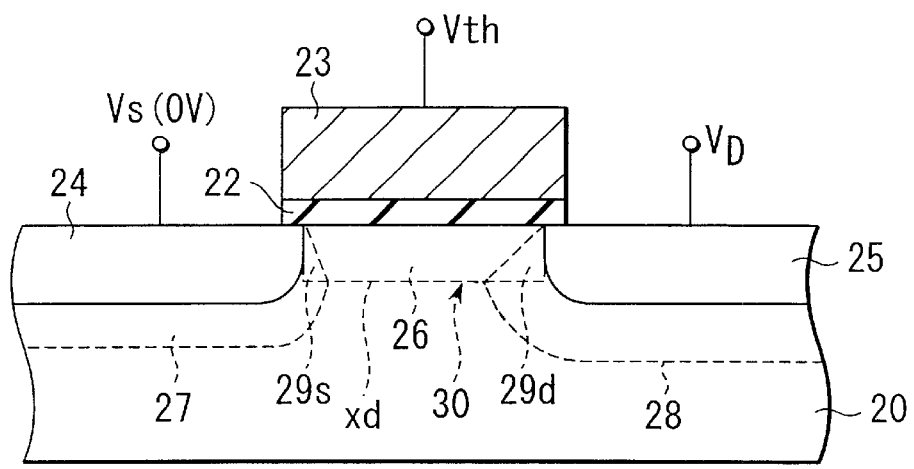
FIG. 4 is a cross-sectional view showing a MOS transistor according to an embodiment of the present invention.

FIG. 4 is a cross-sectional view of a MOS transistor for explaining a semiconductor device according to an embodiment of the present invention.

As shown in the drawing, a gate electrode 23 is formed on a gate oxide film 22, which is formed on a semiconductor substrate 20. Impurity diffusion layers serving as source and drain regions 24 and 25 are formed by, for example, ion implantation in the semiconductor substrate 20 on both sides of the gate electrode 23. The part of the semiconductor substrate 20 between the source and drain regions 24 and 25 serves as a channel region 30. The impurity concentration distribution of the channel region 30 has a concentration profile in which the impurity concentration becomes higher as the depth increases. The impurity concentration of the channel region 30 increases with a positive inclination so as to be higher at least in a surface depletion layer end xd than in the surface of the semiconductor substrate 20. The surface depletion layer end xd corresponds to the thickness of the surface depletion layer 26 which extends when an approximate threshold voltage Vth is applied to the gate electrode 23.

Figure 5A:
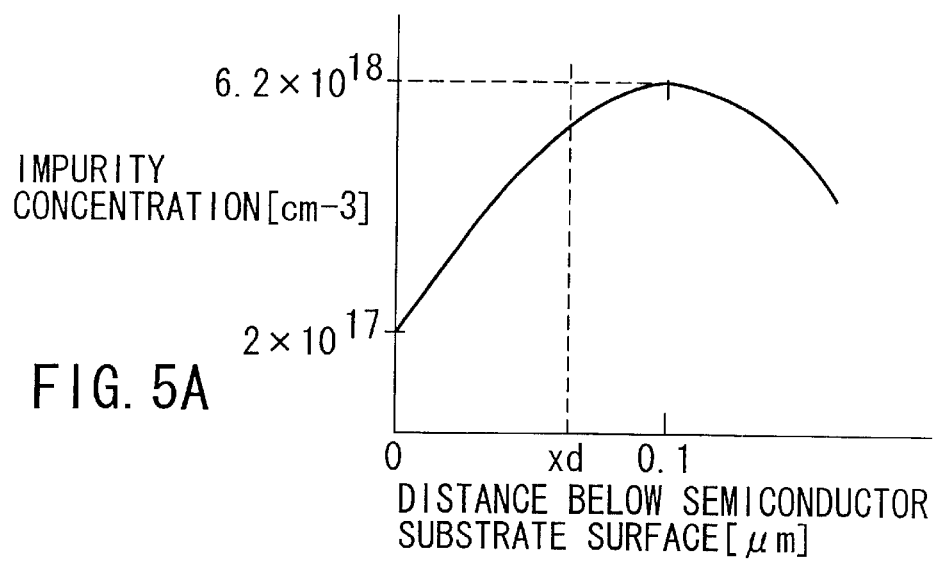
FIG. 5A is a concentration distribution diagram showing an impurity concentration profile in the channel region of the MOS transistor according to the embodiment of the present invention, representing a profile according to a Gaussian distribution along the depth direction.
Figure 5B:
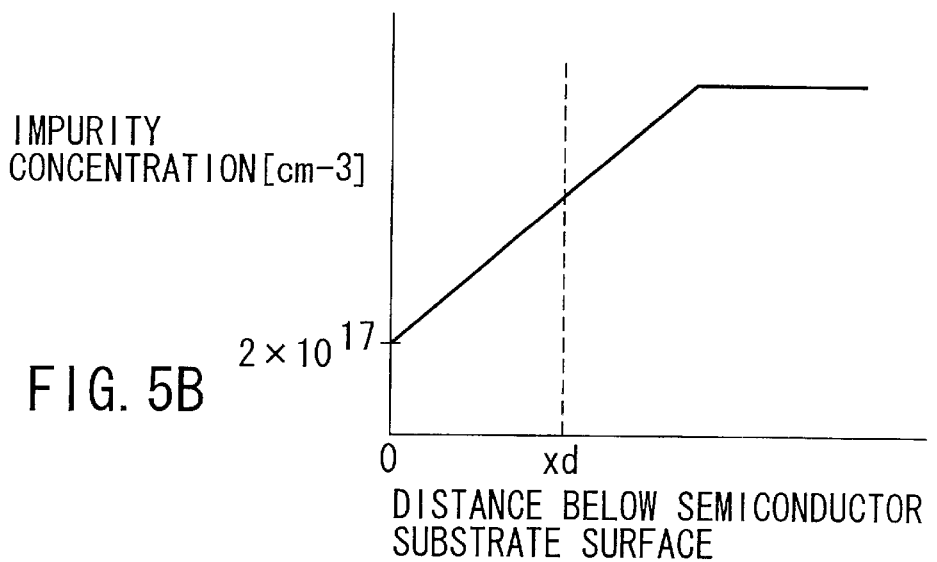
FIG. 5B is a concentration distribution diagram showing an impurity concentration profile in the channel region of the MOS transistor according to the embodiment of the present invention, representing a profile according to a first-order function along the depth direction.
Figure 5C:
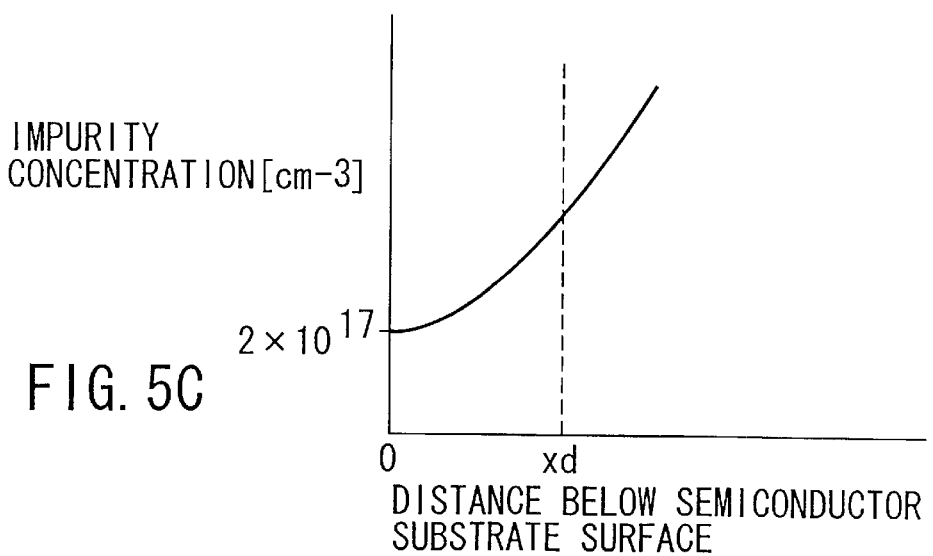
FIG. 5C is a concentration distribution diagram showing an impurity concentration profile in the channel region of the MOS transistor according to the embodiment of the present invention, representing a profile according to a second-order function along the depth direction.

The channel region 30 has an impurity concentration profile as shown in FIG. 5A, 5B or 5C. FIGS. 5A to 5C show impurity concentration profiles along the direction of the depth from the surface of the substrate.

As shown in the drawings, the concentration profile of FIG. 5A conforms to a Gaussian distribution having its peak of $6.2 \times 10^{18}$ cm$^{-3}$ at the distance of 0.1 $\mu$m below the surface. In the concentration profile of FIG. 5B, the concentration is increased in proportion to the depth (as a first-order function). In the concentration profile of FIG. 5C, the concentration is increased in conformity with a quadric curve (as a second-order function). In all cases, the concentration of the surface of the substrate is $2 \times 10^{17}$ cm$^{-3}$.

Figure 6:
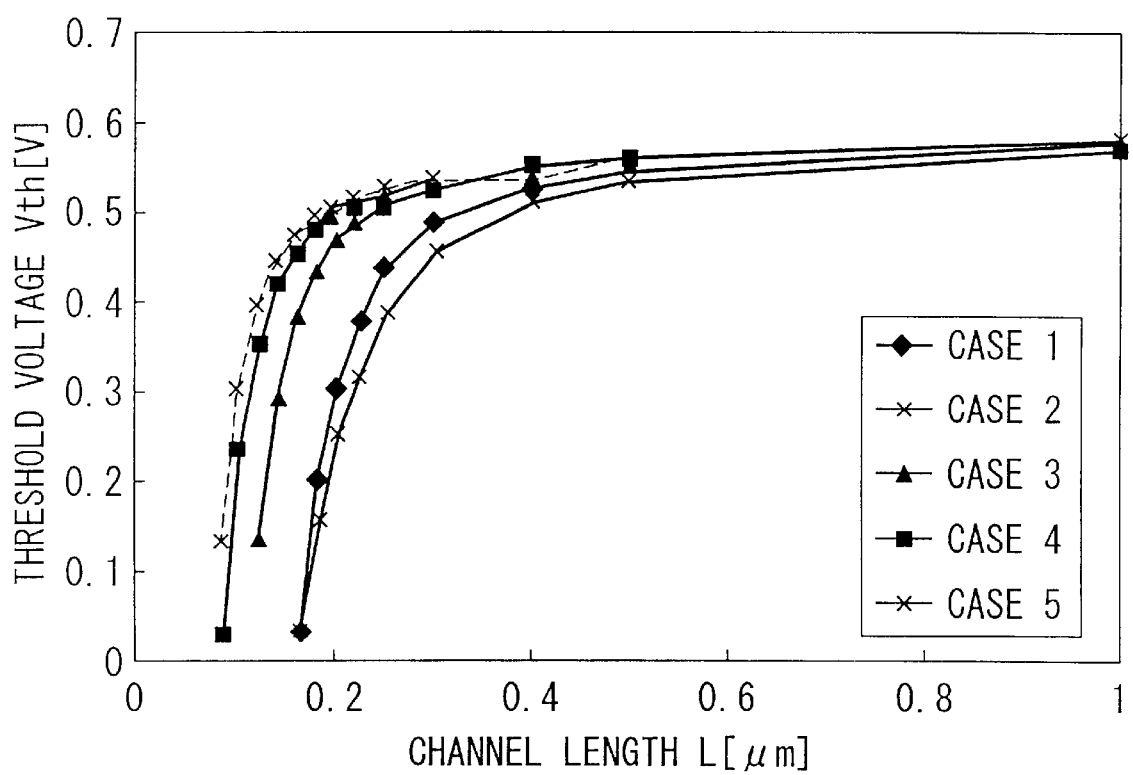
FIG. 6 is a characteristic diagram showing the dependence of a threshold voltage on a channel length in the MOS transistor according to the embodiment of the present invention.

The dependence of a threshold voltage on a channel length in the MOS transistor, having the impurity concentration profiles shown in FIGS. 5A to 5C, is obtained by a computer simulation. FIG. 6 shows the results of the computer simulation along with the results in the conventional cases (cases 1 and 2). In FIG. 6, the impurity concentration profiles shown in FIGS. 5A to 5C are respectively designated as cases 3 to 5. Since the computer simulation faithfully duplicates phenomena which occur in the nature, it is considered to accurately represent realities. In this embodiment, all the concentration profiles are set such that the threshold voltage Vth in the case where the channel is satisfactorily long is set to 0.6V.

As clear from FIG. 6, the short channel effect can be significantly suppressed merely by improving the impurity concentration distribution of the channel region. For example, a MOS transistor having the impurity concentration profile of the case 3 can operate normally, even if the channel length is 0.161 $\mu$m, i.e., about 0.07 $\mu$m shorter than the critical value of the channel length (L=0.230 $\mu$m), which allows the conventional MOS transistor of the case 1 to normally operate. In the cases 4 and 5 of the linear and quadric-curve impurity concentration profiles, the short channel effect is further suppressed. In these cases, the MOS transistor can be operated, even if the channel length is much shorter.

The above results are indicated in the following table. The table shows the lower limit of the channel length L and the reduced amount of channel length L from the case 1 with respect to each of the impurity concentration profiles, on the assumption that the threshold voltage Vth as low as 0.40V is available.

TABLE

| Impurity concentration profile | L for Vth 0.4 V L [μm] | Reduced amount of L Δ L [μm] |
| --- | --- | --- |
| Constant (CASE1) | 0.230 | |
| Surface peak (CASE2) | 0.255 | −0.025 |
| Gaussian distribution (CASE3) | 0.161 | 0.069 |
| Linear (CASE4) | 0.133 | 0.097 |
| Quadric curve (CASE5) | 0.120 | 0.110 |

As shown in the above table, the short channel effect can be suppressed and the lower limit of the channel length L can be reduced by increasing the impurity concentration in the channel region along the depth direction. Particularly in the case 4 or 5, in which the impurity concentration is varied linearly or in conformity with a quadric curve, the lower limit of the channel length L can be significantly reduced, i.e., about 0.1 μm shorter than 0.230 μm. Thus, the channel length can be about half that of the conventional device. This advantage has a significant meaning.

In the above description, the impurity concentration is varied in conformity with the Gaussian distribution, the first-order and second-order functions. However, the distribution of the impurity concentration is not limited to the above, but can be varied in conformity with a third or higher-order function. Alternatively, it may be varied in conformity with a function $x^{0.5}$ or $x^{1.5}$, where x represents a depth. In sum, any function can be applied, so far as the impurity concentration is increased in the direction of the depth of the channel region and the impurity concentration at the surface depletion layer end xd is higher than that at the surface of the substrate. However, as the order of the function is increased, although the short channel effect is reduced, the degree of reduction is smaller. On the other hand, since the concentration is increased, the junction capacitance in the source and drain regions is increased, and a lowering of a breakdown voltage is causes resulting in undesirable situations. Therefore, it is particularly preferable that the impurity concentration is varied linearly to effectively reduce the short channel effect and suppress undesirable side effects.

It is only necessary that the impurity concentration be varied to the surface depletion layer end xd in the channel region. Even if the concentration is constant or reduced in a portion deeper than xd, no problem will arise.

The thickness of the surface depletion layer corresponds to the thickness of the depletion layer at the surface region of the semiconductor substrate. In the case where no substrate voltage is applied, the thickness of the surface depletion layer is determined by $2\phi F$ ($\phi F$ represent a Fermi potential), whereas in the case where a substrate voltage Vsub is applied by a substrate voltage generating circuit or the like, the thickness is determined by $Vsub+2\phi F$. The thickness does not influence the position of xd, if the source potential is increased by a circuit operation. The position of xd represents the position of the depletion layer only in the case where the source potential is zero. However, the surface depletion layer end xd is not strictly limited to the above thickness, but may be slightly different.

A mechanism to suppress the short channel effect in the MOS transistor having an impurity concentration profile mentioned above in the channel region will be described referring again to FIG. 4.

As shown in FIG. 4, a source voltage $V_S$ (0V) is applied to the source region 24 of the MOS transistor, a drain voltage $V_D$ to the drain region 25, and an approximate threshold voltage Vth to the gate electrode 23. As a result, a surface depletion layer 26, a source depletion layer 27 and a drain depletion layer 28 are generated.

More specifically, since the approximate threshold voltage Vth is applied to the gate electrode 23, assuming that the Fermi potential of the semiconductor substrate 20 is $\phi F$, the surface potential of the channel region 30 is kept at about $2\phi F$ in all region (Vsub+2$\phi F$, if the substrate voltage Vsub is applied). Then, the surface depletion layer 26 corresponding to the surface potential extends. At this time, if the impurity concentration N of the semiconductor substrate 20 is constant and the channel is relatively long, the depth xd of the surface depletion layer 26 is calculated as follows:

$$xd=((2\epsilon/qN)\times 2\phi F)^{0.5}$$

where q denotes the charge of a single electron and $\epsilon$ denotes dielectric constant of the semiconductor substrate. Likewise, the depletion layers 27 and 28 are generated at junctions between the substrate 20 and the impurity diffusion layers of the source and drain regions 24 and 25. Since the drain voltage $V_D$ is higher than the source voltage Vs, the drain depletion layer 28 is thicker than the source depletion layer 27.

The threshold voltage Vth of the MOS transistor is determined by a space charge and the like in the surface depletion layer 26. The threshold voltage vth, which forms an inversion layer in an ideal MIS structure, is defined as follows:

$$Vth=2\phi F+\phi MS+(Q_{SS}/C_{OX})+(qN\times xd/C_{OX})$$

where $C_{OX}$ denotes capacitance of the gate oxide film 22, $\phi_{MS}$ denotes a difference in work function between the gate and the semiconductor substrate, and $Q_{SS}$ denotes a surface charge quantity. Since it is assumed that all the space charge in the surface depletion layer 26 essentially contributes to the threshold voltage, the above definition equation of the threshold voltage is established on this assumption. However, if the channel length is short, the space charges in regions 29s and 29d of the surface depletion layer 26 near the source and drain regions, said regions 29s, 29d corresponding to halves the areas where the surface depletion layer 26 overlaps the source and drain depletion layers 27 and 28, are respectively connected to the source and drain regions 24 and 25 by lines of electric force. Accordingly, the space charges in the regions 29s and 29d are not connected to the gate electrode 23 by lines of electric force, and therefore do not contribute to the threshold voltage. The shorter the channel length, the greater the ratio of the regions 29s and 29d which do not contribute to the threshold voltage with respect to the surface depletion layer 26. Therefore, the threshold voltage is lowered considerably. In other words, the value of the fourth term of the above definition equation of the threshold voltage, i.e., the term relating to the impurity concentration N, is reduced, resulting in a lowering of the threshold voltage. This is a qualitative explanation for the short channel effect (to be precise, a more detailed argument is required).

In the MOS transistor of the semiconductor device according to the present invention, the impurity concentration is increased with the depth from the surface of the semiconductor substrate. Therefore, the impurity concentration is higher around the surface depletion layer end and the source and drain depletion layers 27 and 28 extend less as compared to the case of the constant concentration. For this reason, the quantity of those parts of charge of all the space charge in the surface depletion layer 26, which do not contribute to the threshold voltage, is reduced. As a result, the short channel effect can be reduced. Based on the theory described above, it is only necessary that the impurity concentration distribution within the depth corresponding to the surface depletion layer end xd will be taken into consideration.

A method for manufacturing a MOS transistor having the impurity concentration profile in the channel region 30 as described above will now be described with reference to FIGS. 7A to 7D. FIGS. 7A to 7D are cross-sectional views sequentially showing first to fourth steps of a process for manufacturing the MOS transistor according to the present invention.

Figure 7A:
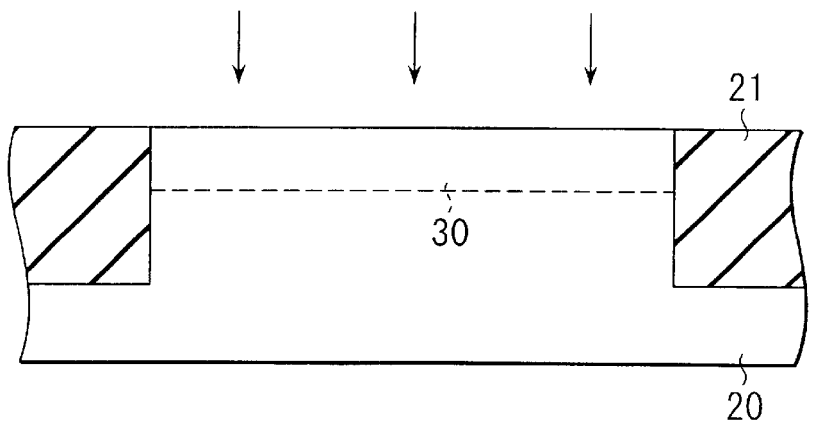
FIGS. 7A to 7D are cross-sectional views showing first to fourth steps of a process for manufacturing the MOS transistor according to the embodiment of the present invention.
Figure 8:
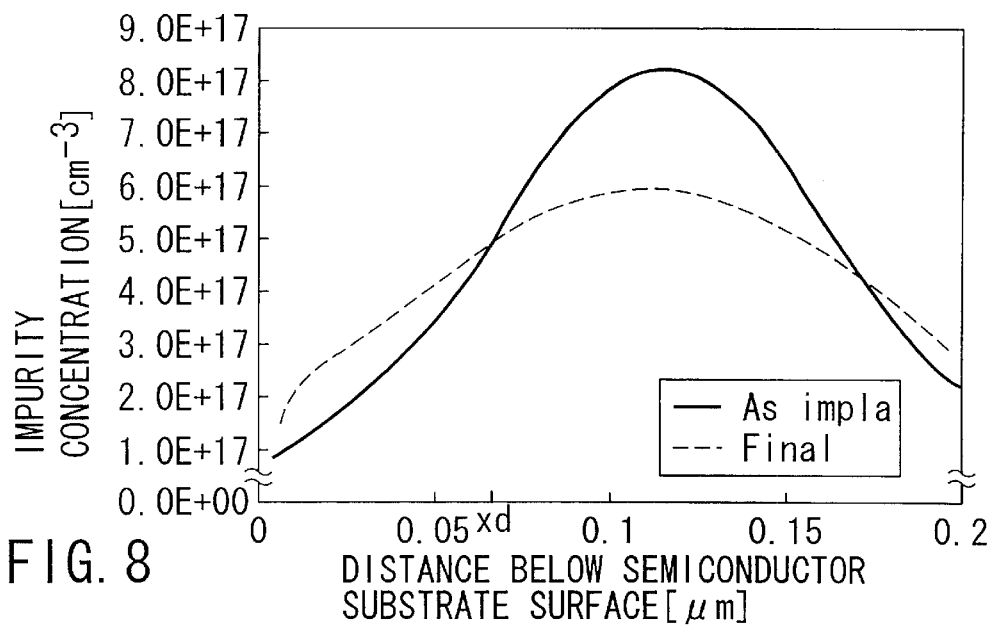
FIG. 8 is a concentration distribution diagram showing an impurity concentration profile in the channel region of the MOS transistor according to the embodiment of the present invention.
Figures 9A, 9B:
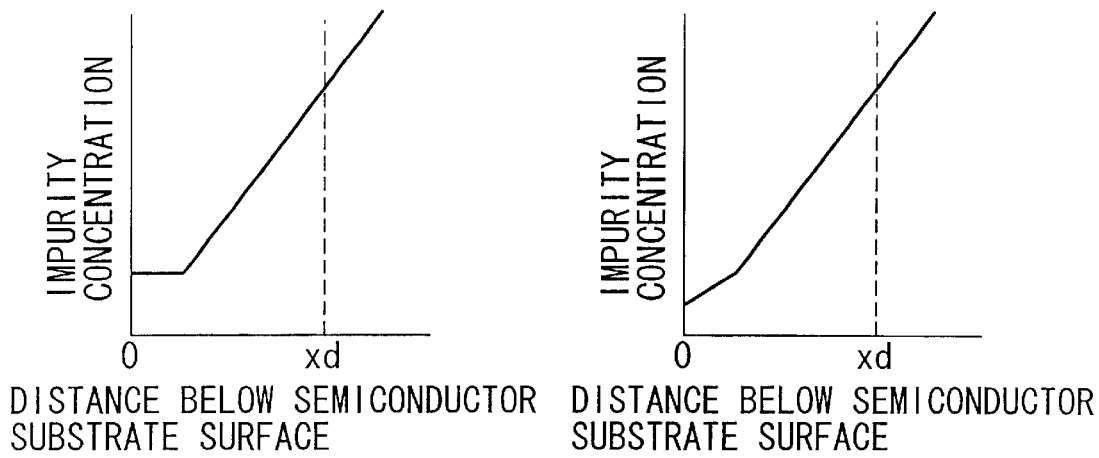
FIG. 9A is a concentration distribution diagram showing a first modification of the impurity concentration profile in the channel region of the MOS transistor according to the embodiment of the present invention.
FIG. 9B is a concentration distribution diagram showing a second modification of the impurity concentration profile in the channel region of the MOS transistor according to the embodiment of the present invention.
Figures 9C, 9D:
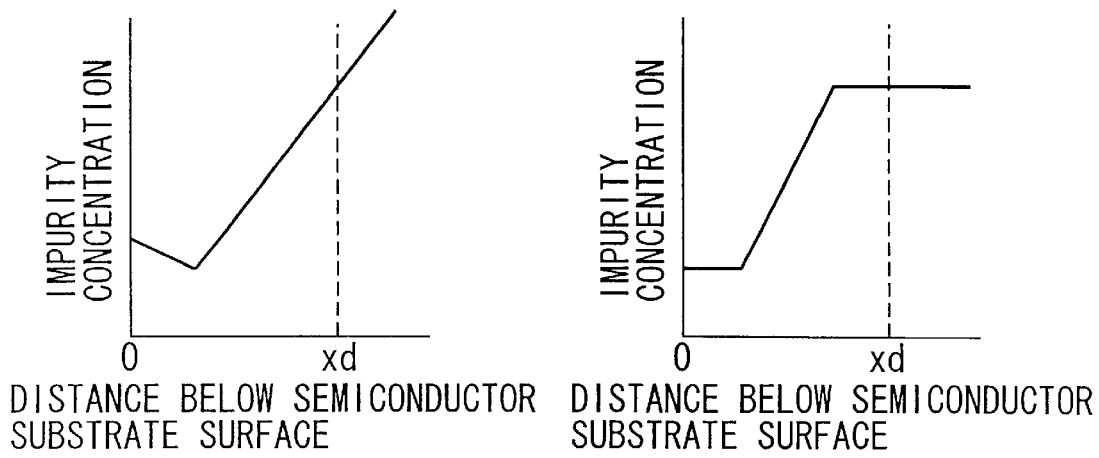
FIG. 9C is a concentration distribution diagram showing a third modification of the impurity concentration profile in the channel region of the MOS transistor according to the embodiment of the present invention.
FIG. 9D is a concentration distribution diagram showing a fourth modification of the impurity concentration profile in the channel region of the MOS transistor according to the embodiment of the present invention.

First, as shown in FIG. 7A, an element isolating trench 21 is formed on a main surface of a p-type semiconductor substrate 20 using STI (Shallow Trench Isolation) technology. The trench 21 is filled with an oxide. Then, boron, as a p-type impurity, is ion-implanted into the substrate under the conditions of an acceleration voltage of 30 kV and a dose of $1.0\times10^{13}$ cm$^{-2}$, thereby forming a channel region 30 having a concentration distribution as indicated by the solid line (As impla) in FIG. 8. FIG. 8 shows impurity concentration profiles, which show a change in impurity concentration along the depth direction from the surface of the semiconductor substrate. In the impurity concentration profiles, the concentration is varied in conformity with a Gaussian distribution having its peak at the depth about 0.11 $\mu$m from the surface of the semiconductor substrate 20.

Figure 7B:
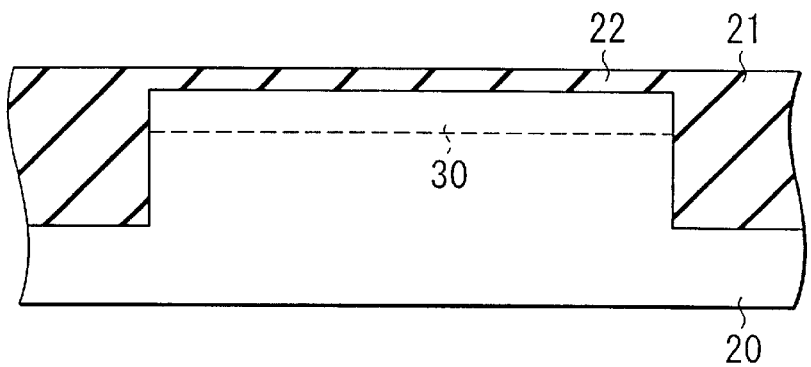

Then, thermal oxidation is carried out for 9 minutes at a temperature of 800° C., thereby forming a gate oxide film 22 of a thickness of 60 Å on the surface of the semiconductor substrate 20, as shown in FIG. 7B.

Figure 7C:
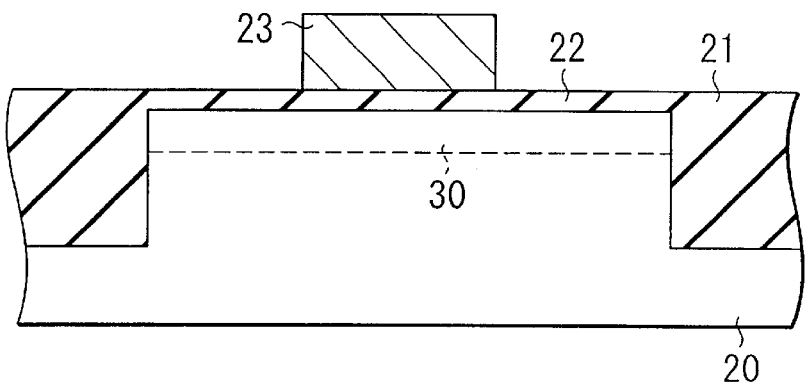

Thereafter, as shown in FIG. 7C, a gate electrode 23 is formed by the well-known art. Then, post-oxidation is carried out to prevent the electric field from concentrating at corner portions of the gate electrode 23. The post-oxidation process is performed by rapid thermal oxidation (RTO) at 1000° C. for 10 seconds so as not to disturb the impurity concentration profile generated by the above process owing to thermal diffusion.

Figure 7D:
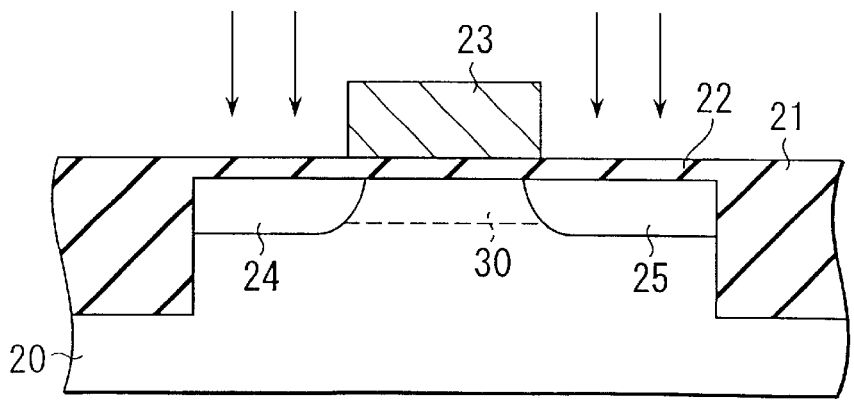

Subsequently, as shown in FIG. 7D, arsenic, as an n-type impurity, is ion-implanted using the gate electrode 23 as a mask, thereby forming a source region 24 and a drain region 25. In this step, since a large quantity of ions are implanted into the semiconductor substrate 20, a crystal defect may occur. To disappear the defect, an anneal process is carried out after a diffusion layer is formed. As in the post-oxidation process described above, rapid thermal annealing (RTA) is performed at 900° C. for 10 seconds so as not to disturb the impurity concentration profile.

Then, a MOS transistor is completed through the known processes of several annealing steps and a step of forming a metal wiring layer.

The final impurity concentration distribution in the channel region 30 of the MOS transistor, produced by the method described above, is indicated by the broken line (Final) in FIG. 8. Owing to the thermal processes, the final concentration distribution is wider than the concentration distribution immediately after the ion implantation indicated by the solid line in FIG. 8. However, since the thermal processes are carried out in short periods of time by employing rapid processes, such as RTO and RTA, the thermal diffusion of the impurity is suppressed to the minimum, resulting in keeping the impurity concentration low at the surface of the semiconductor substrate. Thus, the impurity concentration profile, in which the concentration is increased with the depth, is realized.

It is understandable from FIG. 8 that the surface depletion layer thickness xd in this embodiment is 0.056 $\mu$m, and the impurity concentration is varied substantially linearly in the surface depletion layer, in the case where no substrate voltage is applied and the channel is relatively long. Thus, a substantially desirable impurity concentration is obtained.

A desired impurity concentration distribution can be created more accurately, if molecular beam epitaxy or the like is used.

According to the constitution and the manufacturing method described above, the impurity concentration is increased with the depth from the semiconductor substrate surface, so that the impurity concentration near the surface depletion layer end is higher than that of the substrate surface. Therefore, the depletion layers of the source and drain regions are less extended. Thus, it is possible to provide a semiconductor device having a more refined and stable high-performance MOS transistor, in which the short channel effect is particularly suppressed.

In the above embodiment, the impurity concentration is varied linearly or in conformity with a quadric curve in the overall region to the surface depletion layer end. However, it may be varied such that the profile projects downward, that is, the differential coefficient of the second order is positive. Further, as modifications, the impurity concentration distribution along the depth may be as shown in FIGS. 9A to 9D; that is, the impurity concentration may be constant near the surface of the semiconductor surface, the inclination may be changed in the middle of the profile, or the concentration may be substantially constant at the surface depletion layer end. This is because the state of the impurity distribution near the surface depletion layer end is important, since, according to the present invention, the short channel effect is particularly reduced at the surface depletion layer end due to the high impurity concentration at the end. Moreover, the impurity concentration distribution is not limited to the modifications shown in FIGS. 9A to 9D. A part of a profile of these distributions may be varied in conformity with a second-order function or a Gaussian distribution. It is preferable that the impurity concentration distribution as described above is applied to the overall channel region extending from the source region to the drain region. However, the impurity concentration distribution may be partially changed, for example, near the source or drain region. Moreover, the present invention are applicable to a vertical MOS transistor, and a MIS transistor having a gate insulating film other than a gate oxide film. In these cases also, the same effect and advantage as described above can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   source and drain regions spaced apart from each other in a semiconductor layer;

a gate insulating film formed on a surface of the semiconductor layer between the source and drain regions;

a gate electrode formed on the gate insulating film, said gate insulating film being interposed between the semiconductor layer and the gate electrode; and a channel region, formed in contact with at least a portion of the gate insulating film, including a region where carriers move between the source and drain regions, an impurity concentration of said channel region being higher at an end portion of a surface depletion layer, formed of a MIS structure comprising the gate electrode, the gate insulating film and the semiconductor layer, than at an interface between the semiconductor layer and the gate insulating film;

wherein the impurity concentration varies along a direction in which the gate electrode, the gate insulating film and the channel region are successively provided, and it increases substantially linearly near the end portion of the surface depletion layer.

2. A semiconductor device according to claim 1, wherein the impurity concentration varies along a direction in which the gate electrode, the gate insulating film and the channel region are successively provided, and it varies substantially linearly near the end portion of the surface depletion layer over all portion of the channel region.

3. A semiconductor device according to claim 1, wherein the channel region is formed by ion implantation and rapid thermal processes.

4. A semiconductor device comprising:

source and drain regions spaced apart from each other in a semiconductor layer;

a gate insulating film formed on a surface of the semiconductor layer between the source and drain regions;

a gate electrode formed on the gate insulating film, said gate insulating film being interposed between the semiconductor layer and the gate electrode; and a channel region, formed in contact with at least a portion of the gate insulating film, including a region where carriers move between the source and drain regions, an impurity concentration of said channel region being higher at an end portion of a surface depletion layer, formed of a MIS structure comprising the gate electrode, the gate insulating film and the semiconductor layer, than at an interface between the semiconductor layer and the gate insulating film;

wherein the impurity concentration varies along a direction in which the gate electrode, the gate insulating film and the channel region are successively provided, and has an inclination greater at the end portion of the surface depletion layer than at the interface between the semiconductor layer and the gate insulating film.

5. A semiconductor device according to claim 4, wherein the impurity concentration varies along a direction in which the gate electrode, the gate insulating film and the channel region are successively provided, and has the inclination greater at the end portion of the surface depletion layer than at the interface between the semiconductor layer and the gate insulating film over all portion of the channel region.

6. A semiconductor device according to claim 4, wherein the channel region is formed by ion implantation and rapid thermal processes.

7. A semiconductor device comprising:

source and drain regions spaced apart from each other in a semiconductor layer;

a gate insulating film formed on a surface of the semiconductor layer between the source and drain regions;

a gate electrode formed on the gate insulating film, said gate insulating film being interposed between the semiconductor layer and the gate electrode; and a channel region, formed in contact with at least a portion of the gate insulating film, including a region where carriers move between the source and drain regions, an impurity concentration of said channel region being higher at an end portion of a surface depletion layer, formed of a MIS structure comprising the gate electrode, the gate insulating film and the semiconductor layer, than at an interface between the semiconductor layer and the gate insulating film;

wherein the impurity concentration varies along a direction in which the gate electrode, the gate insulating film and the channel region are successively provided, and its differential coefficient of a second order near the surface depletion layer is positive.

8. A semiconductor device according to claim 7, wherein the impurity concentration varies along a direction in which the gate electrode, the gate insulating film and the channel region are successively provided, and its differential coefficient of a second order near the surface depletion layer is positive over all portion of the channel region.

9. A semiconductor device according to claim 7, wherein the channel region is formed by ion implantation and rapid thermal processes.

10. A semiconductor device comprising:

source and drain regions spaced apart from each other in a semiconductor layer;

a gate insulating film formed on a surface of the semiconductor layer between the source and drain regions;

a gate electrode formed on the gate insulating film, said gate insulating film being interposed between the semiconductor layer and the gate electrode; and a channel region, formed in contact with at least a portion of the gate insulating film, including a region where carriers move between the source and drain regions, an inclination of an impurity concentration of said channel region being positive at an end portion of a surface depletion layer formed of a MIS structure comprising the gate electrode, the gate insulating film and the semiconductor layer.

11. A semiconductor device according to claim 10, wherein the impurity concentration varies along a direction in which the gate electrode, the gate insulating film and the channel region are successively provided, and it varies substantially linearly near the end portion of the surface depletion layer.

12. A semiconductor device according to claim 11, wherein the impurity concentration varies along a direction in which the gate electrode, the gate insulating film and the channel region are successively provided, and it varies substantially linearly near the end portion of the surface depletion layer over all portion of the channel region.

13. A semiconductor device according to claim 10, wherein the impurity concentration varies along a direction in which the gate electrode, the gate insulating film and the channel region are successively provided, and it varies substantially linearly in the surface depletion layer.

14. A semiconductor device according to claim 13, wherein the impurity concentration varies along a direction in which the gate electrode, the gate insulating film and the channel region are successively provided, and it varies substantially linearly in the surface depletion layer over all portion of the channel region.

15. A semiconductor device according to claim 10, wherein the impurity concentration varies along a direction in which the gate electrode, the gate insulating film and the channel region are successively provided, and its differential coefficient of a second order near the surface depletion layer is positive.

16. A semiconductor device according to claim 15, wherein the impurity concentration varies along a direction in which the gate electrode, the gate insulating film and the channel region are successively provided, and its differential coefficient of a second order near the surface depletion layer is positive over all portion of the channel region.

17. A semiconductor device according to claim 10, wherein the channel region is formed by ion implantation and rapid thermal processes.

18. A semiconductor device comprising:
   source and drain regions spaced apart from each other in a semiconductor layer;
   a gate insulating film formed on a surface of the semiconductor layer between the source and drain regions;
   a gate electrode formed on the gate insulating film, said gate insulating film being interposed between the semiconductor layer and the gate electrode; and
   a channel region, formed in contact with at least a portion of the gate insulating film, including a region where carriers move between the source and drain regions, an inclination of an impurity concentration of said channel region being positive at an end portion of a surface depletion layer formed of a MIS structure comprising the gate electrode, the gate insulating film and the semiconductor layer,
   wherein the impurity concentration varies along a direction in which the gate electrode, the gate insulating film and the channel region are successively provided, and the inclination of the impurity concentration is greater at the end portion of the surface depletion layer than at the interface between the semiconductor layer and the gate insulating film.

19. A semiconductor device according to claim 18, wherein the impurity concentration varies along a direction in which the gate electrode, the gate insulating film and the channel region are successively provided, and the inclination of the impurity concentration is greater at the end portion of the surface depletion layer than at the interface between the semiconductor layer and the gate insulating film over all portion of the channel region.

* * * * *